United States Patent [19]

Kang

[11] 4,053,923
[45] Oct. 11, 1977

[54] INTEGRATED LOGIC ELEMENTS WITH IMPROVED SPEED-POWER CHARACTERISTICS

[75] Inventor: S. Daniel Kang, Houston, Tex.

[73] Assignee: Motorola, Inc., Chicago, Ill.

[21] Appl. No.: 726,083

[22] Filed: Sept. 23, 1976

[51] Int. Cl.² .................................................. H01L 27/04
[52] U.S. Cl. ...................................... 357/51; 307/213; 357/35; 357/44; 357/46
[58] Field of Search ................. 357/51, 44, 46, 35, 357/36; 307/303, 213

[56] References Cited

U.S. PATENT DOCUMENTS 3,916,218  10/1975  Berger .................................. 307/213

Primary Examiner—Stanley D. Miller, Jr.
Assistant Examiner—James W. Davie
Attorney, Agent, or Firm—Lowell E. Clark

[57] ABSTRACT

Transistor logic elements with improved switching speed at a given power. The improvement arises from shunting the current-source transistor in a two-transistor gate by a resistor. The integrated embodiment requires no more area than the conventional structure without the resistor.

2 Claims, 5 Drawing Figures

INTEGRATED LOGIC ELEMENTS WITH IMPROVED SPEED-POWER CHARACTERISTICS

SUMMARY OF THE INVENTION

Logic elements consisting solely of transistors have been described in U.S. Pat. No. 3,736,477 which discloses a monolithic combination of an inversely-operated vertical transistor merged with a lateral transistor. Such elements can be operated at less than 1 volt, and have a low speedpower product, which is relatively constant at low currents so that the elements consume power in proportion to their speed. For large logic arrays, low power requirements can be essential, but it is ordinarily desirable to achieve the highest speed commensurate with this power dissipation, which is the object of this invention. It is disclosed that the speed of transistor logic elements such as those recited in U.S. Pat. No. 3,736,477 can be substantially improved by adding a resistor in parallel with the lateral transistor. In integrated form, the area required is no greater than required by the conventional elements, but the speed has been found to be improved by a factor of approximately 3.

DETAILED DESCRIPTION

Figure 1:
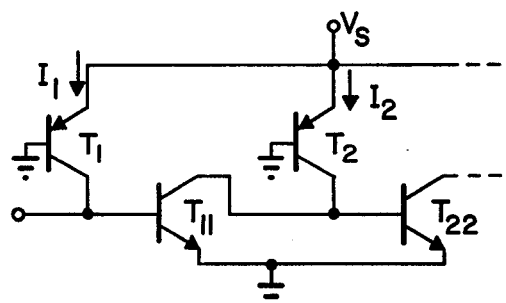
FIG. 1 is a schematic of interconnected two-transistor logic gates.

FIG. 1 shows cascaded logic gates each comprising two transistors. Each gate consists of a PNP transistor ($T_1$ or $T_2$) supplying current to the base of an NPN transistor ($T_{11}$ or $T_{22}$). To turn on the PNP transistor requires a supply voltage $V_S$ of only one forward diode drop ($V_F$), about 600 to 800 millivolts for silicon transistors. When the input to the base of $T_{11}$ is low, current $I_1$ is diverted from the base of $T_{11}$ and $T_{11}$ is off. Thus only leakage current flows at the collector of $T_{11}$ and current $I_2$ flows mainly into the base of $T_{22}$, causing $T_{22}$ to be on. $T_1$ is in the active state and $T_2$ is saturated under these conditions. When the external connection to the base of $T_{11}$ is opened, $T_1$ saturates and $I_1$ flows mainly into the base of $T_{11}$ so that $T_{11}$ turns on, causing $T_{22}$ to turn-off. The speed at which $T_{11}$ turns on is proportional to $I_1$ at low currents when the circuit and device capacitances dominate; at higher currents the speed becomes nearly independent of current because the frequency response of the transistors limit the switching speed.

Figure 2:
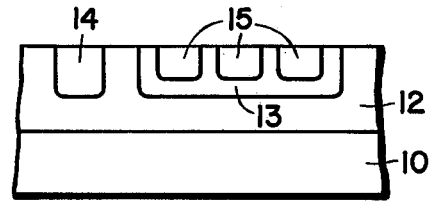
FIG. 2 is a cross-section of a monolithic embodiment of one of the gates of FIG. 1.

FIG. 2 shows a monolithic embodiment of one of the gates in FIG. 1. Here 14 is the emitter, 12 is the base and 13 is the collector of the PNP transistor, while 12 is the emitter, 13 is the base and 15 is the collector of the NPN transistor. Region 12 is a body of N conductivity type, 13 and 14 are P-type regions in the body 12, and regions 15 are N-type inclusions in region 13. Thus the PNP transistor is realized as a lateral transistor, the NPN transistor is realized as a vertical transistor operated in the inverse mode, and the collector of the PNP transistor and the base of the NPN transistor are merged, as are the base of the PNP transistor and the emitter of the NPN transistor. The NPN transistor may be provided with multiple collectors 15 to allow fan-out to a multiplicity of other gates. Also the conductivity types of the two transistors may be reversed, i.e., $T_1$ could be an NPN transistor in lateral form while $T_{11}$ could be an inversely operated PNP transistor. In the integrated form shown in FIG. 2, the speed is limited primarily by the lateral PNP transistor, which has a relatively wide basewidth compared with the vertical NPN transistor. The wide base of this PNP transistor together with the relatively poor geometrical emitter efficiency due to the fact that carriers emitted from the region 14 away from the side adjacent region are relatively unlikely to be collected by region 13 means that the gain of the PNP transistor is relatively low. Thus a substantial proportion of the current of the current $I_1$ in the gate comprising $T_1$-$T_{11}$ is diverted to ground rather than into the base of $T_{11}$, causing an increase in the turn-on time of $T_{11}$ compared to the case where the gain of $T_1$ is large.

Figure 3:
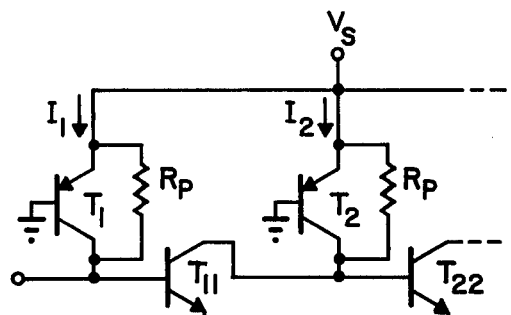
FIG. 3 is representative of two-transistor logic elements according to the present invention.
Figure 4:
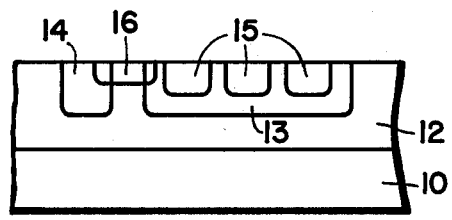
FIG. 4 is a cross-section of one possible monolithic embodiment of one of the gates in FIG. 3.

With reference to FIG. 3, according to the present invention it has unexpectedly been found that the addition across the PNP transistor of a shunt resistor $R_p$ of appropriate value will increase the switching speed of the gate for a given total average gate current $I_1$. The effect is qualitatively explained as follows. Since the base of transistor $T_{11}$ is near ground potential when $T_{11}$ is off, and since $V_S$ is on the order of a diode drop $V_F$, the initial current into the base node of $T_{11}$ as it starts to turn-on will be on the order of $V_F/R_P$. Thus for a given $I_1$, less current flows in $T_{11}$, so that its stored charge is reduced. As the base potential of $T_{11}$ will rise to nearly $V_S$ when $T_{11}$ is on, very little current flows in $R_P$ in this state, so that the shunt resistor serves primarily to increase the base drive to $T_{11}$ during the critical turn-on phase, without adding significantly to the current drain when $T_{11}$ is on. If $I_1$ is large compared with $V_F/R_P$, then the shunt resistor has little effect on the power-speed product of the gate. If $I_1$ is approximately equal to $V_F/R_P$, the gate is speeded up significantly with respect to an equivalent gate without the shunt resistor but operated at the same average current $I_1$ per gate. On the other hand, the gate will not operate at all below a certain minimum $I_1$. Clearly $V_S$ must be at least about $V_F$ for transistors $T_{11}$ and $T_{22}$ to turn on at all. If $T_{22}$ is to be held off by on transistor $T_{11}$, then $T_{11}$ must sink a current of about $V_F/R_P$. Thus the base drive to $T_{11}$, and hence $I_1$, must be at least about $V_F/\beta_N R_P$, where $\beta_N$ is the current gain of the NPN transistor $T_{11}$. For a typical operating current of 60$\mu$A/gate the value of $R_P$ required for significant speed enhancement will be about 600mV/60$\mu$A = 10,000 ohms. Thus a lightly doped region 16 of the same conductivity type as regions 13 and 14 and interposed therebetween as in FIG. 4 can provide the current of FIG. 3 without any increase in the area required. Resistance values on the order of 10,000 ohms per square are easily achieved, for example, by ion implantation. Alternatively, the shunt resistor $R_P$ could be formed by an ion implantation or an out diffusion simultaneously with the formation of the active base (that portion of 13 lying on a vertical line between regions 12 and 15) of the vertical transistor, or by thin film means.

Figure 5:
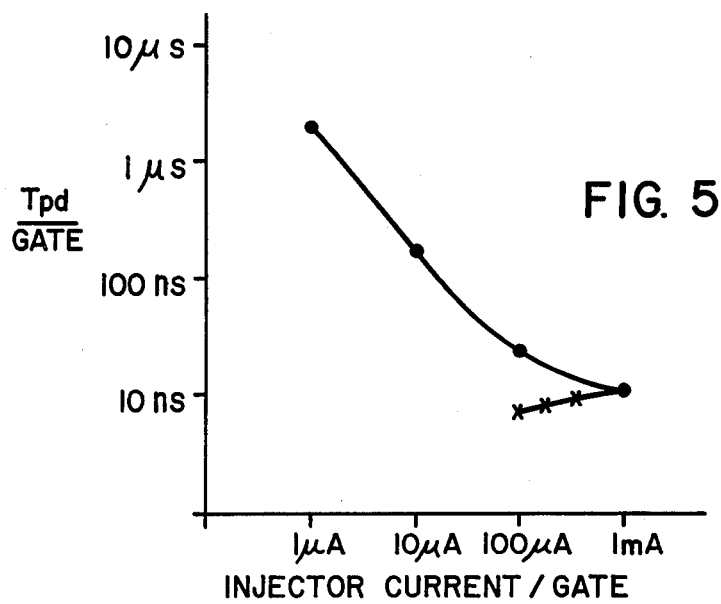
FIG. 5 shows a comparison of the propagation delay versus gate current characteristics of the gates in the conventional and improved forms.

FIG. 5 shows the propagation delay per gate versus the average current per gate for the circuits of FIG. 1 and FIG. 3. The circled data points represent the performance of a gate without the shunt resistor; below 10μA the powerspeed product is nearly constant at 1.5 picojoules. The data points represented by an X are for a physically similar gate with the addition of an approximately 6,000 ohm shunt resistor between the emitter and collector of the PNP transistor. The resistor-shunted gates would not toggle at 10μA average current per gate; at 100μA the resistor shunted gates are about three times faster than their unshunted counterparts. Above about 1mA, the speed performance is virtually the same. Since most small geometry logic cells implementing the circuit of FIG. 1 will have a performance similar to the curve comprising the circled data in FIG. 5, values of $R_P$ from 1K ohms to 100K ohms should be useful in implementing the gates represented by FIG. 3.

What is claimed is:

1. In a monolithic semiconductor circuit comprising a semiconductor body of a first conductivity type, a pair of mutually spaced regions in said body and each of a second conductivity type, said regions constituting respectively the emitter and collector regions of a lateral transistor, said collector region having therewithin a region of said first conductivity type constituting the collector of an inversely operated vertical transistor, said collector region of said lateral transistor constituting the base region of said vertical transistor, said semiconductor body constituting the base region of said lateral transistor and the emitter region of said vertical transistor, said collector and base regions of said vertical transistor having therebetween a collector base P-N junction, said base and emitter regions of said vertical transistor having therebetween a base-emitter P-N junction, conductive means for reverse biasing said collector-base junction and forward biasing said base-emitter junction, conductive means for receiving a control signal at the base of said vertical transistor, wherein the improvement comprises a shunt resistive means connected between said collector and said emitter of said lateral transistor for increasing the switching speed of said circuit.

2. the circuit of claim 1, wherein said resistive means has a resistance in the range of 1,000 ohms to 100,000 ohms.